United States Patent [19]

Maeda et al.

[11] Patent Number: 5,449,588
[45] Date of Patent: Sep. 12, 1995

[54] PHOTOSENSITIVE POLYIMIDE PRECURSOR COMPOSITION WITH PHOTOACID GENERATOR

[75] Inventors: Hirotoshi Maeda; Eiji Watanabe; Kouichi Katou, all of Yokohama; Kouichi Kunimune, Ichibara, all of Japan

[73] Assignee: Chisso Corporation, Osaka, Japan

[21] Appl. No.: 250,573

[22] Filed: May 27, 1994

[30] Foreign Application Priority Data

Feb. 15, 1994 [JP] Japan .................. 6-40383

[51] Int. Cl.$^6$ ............... G03F 7/075; C08G 73/10
[52] U.S. Cl. .................... 430/270; 522/31; 522/52; 522/57; 522/148; 522/164
[58] Field of Search ............ 522/148, 164, 31, 52, 522/57; 528/25, 26, 35; 430/270

[56] References Cited

U.S. PATENT DOCUMENTS

| | | | |
|---|---|---|---|
| 3,926,911 | 12/1975 | Greber et al. | 528/26 |
| 4,748,228 | 5/1988 | Shoji et al. | 528/28 |
| 5,025,088 | 6/1991 | Maeda et al. | 528/352 |
| 5,055,549 | 10/1991 | Maeda et al. | 528/310 |
| 5,071,908 | 12/1991 | Kunimune et al. | 528/34 |
| 5,320,935 | 6/1994 | Maeda et al. | 430/325 |
| 5,342,739 | 8/1994 | Katou et al. | 430/327 |

FOREIGN PATENT DOCUMENTS

| | | |
|---|---|---|
| 54-145794 | 11/1979 | Japan . |
| 2144539 | 6/1990 | Japan . |
| 3763 | 1/1991 | Japan . |
| 4120171 | 4/1992 | Japan . |

OTHER PUBLICATIONS

Buhr et al, "Non-ionic Photogenerating Compounds", *Polymeric Materials: Science and Engineering* vol. 61, pp. 269-277, Sep. 1989.

*Primary Examiner*—Susan W. Berman
*Attorney, Agent, or Firm*—Leydig, Voit & Mayer

[57] ABSTRACT

A photosensitive resin composition containing 0.5 to 15 parts by weight of a compound generating an acid by light irradiation in 100 parts by weight of a polyamic acid amide having an alkoxysilane having a specified structure at its terminals are provided, which composition has superior resolution properties, a small shrinkage of volume, a superior adhesion onto a substrate, and can prepare a polyimide by baking.

4 Claims, No Drawings

PHOTOSENSITIVE POLYIMIDE PRECURSOR COMPOSITION WITH PHOTOACID GENERATOR

BACKGROUND OF THE INVENTION (i) Field of the Invention

The present invention relates to a photosensitive resin composition. More specifically, it relates to a negative type photosensitive resin composition having an excellent sensitivity and resolving properties which can inhibit volume shrinkage at the time of curing, can suitably adhere to a substrate, and can form a polyimide coating film pattern having a good heat-resistance on the substrate by baking.

(ii) Description of the Related Art

Photosensitive polyimides which are heat-resistant photosensitive materials have been widely used as insulating films and passivation films for semiconductors. The well known photosensitive polyimides can be prepared by mixing a polyimide precursor with a compound having a carbon-carbon double bond capable of polymerizing by light irradiation, or chemically bonding the above-mentioned compound to the above-mentioned precursor by an ester linkage. For example, they are disclosed in Japanese Patent Application Laid-open Nos. (Sho)54-145794 and (Hei)2-144539, and Japanese Patent Publication No. (Sho)55-41422. However, for any of these polyimides, it is necessary to introduce a large amount, such as 50% by weight or more, of the compound having the carbon-carbon double bond into the polyimide precursor in order to practically carry out patterning, so that the deterioration of the resolving properties and the large volume shrinkage at curing can be avoided. On the other hand, there has also been suggested a method in which instead of the compound having the carbon-carbon double bond, a compound for generating an acid by light irradiation is used, whereby the above-mentioned problems can be solved. For example, Japanese Patent Application Laid-open No. (Hei)3-763 discloses a method which comprises blending the compound for generating an acid by light irradiation with a polyimide having an acyloxy group, and Japanese Patent Application Laid-open No. (Hei)4-120171 discloses a method which comprises blending the above-mentioned compound with a polyamic acid derivative into which an organic group is introduced by an ester linkage, whereby the formation of a positive type pattern can be achieved. These compositions obtained by these methods have excellent sensitvity and resolution properties can inhibit the volume shrinkage at the time of curing, but the adhesion of them to the substrate is so poor that they are not practical.

SUMMARY OF THE INVENTION

An object of the present invention is to provide a negative type photosensitive resin composition having an excellent sensitivity and resolving properties which can inhibit volume shrinkage at the time of curing, can possess a good adhesion to a substrate and can afford patterns of polyimide films on a plate by baking.

The present inventors have intensively conducted investigation with an intention of solving the above-mentioned problems of known techniques, and as a result, they have found that these problems can be solved by a composition comprising a specific polyimide precursor having its molecular terminal reacted with an aminosilicon compound having a hydrolytic alkoxy group bonded to a silicon atom, and also a compound for generating an acid with the aid of light. In consequence, the present invention has now been completd.

The present invention has the following constitutions (1) to (3):

(1) A photosensitive resin composition comprising the following (b) and (c):

(b) at least one polyamic acid amide selected from the group consisting of the following groups (ba) and (bb):

(ba) a silicon-containing polyimide precursor obtained from

A mol of a derivative formed by adding 2 mols or less of a primary or secondary amine represented by the formula (2) or (3):

wherein $R^6$ represents at least one organic group of 1 to 8 carbon atoms, $R^7$ is a hydrogen atom or a monovalent organic group of 1 to 7 carbon atoms and $R^8$ represents a divalent organic group of 1 to 8 carbon atoms, to one mol of a tetracarboxylic dianhydride represented by the formula (1):

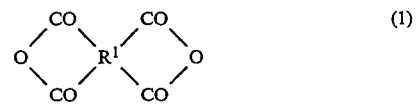

wherein $R^1$ is at least one tetravalent organic group selected from the group consisting of a tetravalent carbocyclic aromatic group, a heterocyclic group, an alicyclic group and an aliphatic group, each group having 4 to 30 carbon atoms, B tool of a diamine represented by the formula (4):

$$H_2N-R^3-NH_2 \qquad (4)$$

wherein $R^3$ represents at least one divalent organic group of 2 to 30 carbon atoms, selected from the group consisting of an aliphatic group, an alicyclic group, an araliphatic group and a carbocyclic aromatic group, or a divalent polysiloxane group having a hundred or less siloxane units, and C mol of an aminosilicon compound represented by the formula (5):

$$H_2N-R^4-SiR^5{}_{3-k}X_k \qquad (5)$$

wherein $R^4$ represents

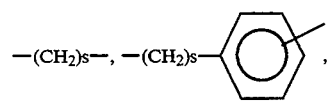

-continued

R⁵ represents an alkyl group of 1 to 6 carbon atoms, a phenyl group or a phenyl group substitued by an alkyl group of 7 to 12 carbon atoms, s is an integer of 1 to 4, X represents a hydrolytic alkoxy group, and k is $1 \leq k \leq 3$, the ratio of (A), (B) and (C) satisfying the following formulas (6) and (7):

$$1 \leq \frac{C}{A-B} \leq 2.5 \quad (6)$$

$$0.1 \leq \frac{C}{B+C} \leq 1; \quad (7)$$

and (bb) a silicon-containing polyamic acid amide obtained by amidating said precursor (ba) with said monovalent amine represented by the formula (2) or (3), and (c) a compound for generating an acid by light irradiation.

(2) A photosensitive resin composition according to item (1), wherein said X in the formula (5) is an alkoxyl group of 1 to 4 carbon atoms and R⁴ is a phenylene group or a trimethylene group.

(3) A photosensitive resin composition according to item (1), wherein the quantity of said compound for generating an acid by light irradiation (c) falls within a range of 0.5 to 15 parts by weight based upon 100 parts by weight of said polyamic acid amide (b).

DETAILED DESCRIPTION OF PREFERRED EMBODIMENTS

The polyamic acid amide which can be used for the photosensitive resin composition of the present invention can be typically obtained by either one of the following two methods:

According to the first method, the polyamic acid amide can be obtained by reacting a mixture comprising at least one of the groups represented by the following formulas (8) and (9), to form amide bonds:

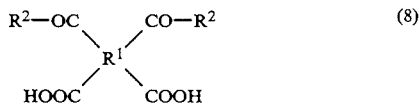

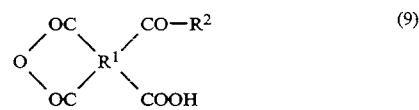

wherein R¹ is at least one tetravalent organic group such as a tetravalent carbocyclic aromatic group, a heterocyclic group, an alicyclic group or an aliphatic group of 4 to 30 carbon atoms, and R² is an amino group represented by the formula

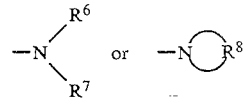

(wherein R⁶ is independently a monovalent organic group of 1 to 8 carbon atoms, R⁷ is a hydrogen atom or a monovalent organic group of 1 to 7 carbon atoms and R⁸ is a divalent organic group of 1 to 8 carbon atoms), formed by adding 2 mols or less of a monovalent amine represented by the formula (2) or (3):

to one tool of the tetracarboxylic dianhydride represented by the aforementioned formula (1) or a mixture thereof with a diamine represented by the formula (4):

$$H_2N-R^3-NH_2 \quad (4)$$

wherein R³ represents at least one divalent organic group of 2 to 30 carbon atoms selected from the group consisting of an aliphatic group, an alicyclic group, an araliphatic group and a carbocyclic aromatic group, or a divalent polysiloxane group having a hundred or less siloxane units and the aminosilicon compound represented by the formula (5)

$$H_2N-R^4-SiR^5{}_{3-k}X_k \quad (5)$$

wherein R⁴ is $-(CH_2)_s-$,

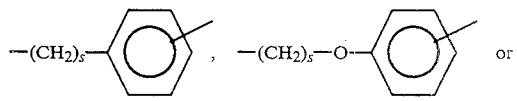

(wherein s is an integer of 1 to 4), R⁵ is independently an alkyl group having 1 to 6 carbon atoms, a phenyl group or a phenyl group substituted by an alkyl group having 7 to 12 carbon atoms, X is a hydrolytic alkoxyl group and k is $1 \leq k \leq 3$, at a temperature of 0° to 100° C., preferably 10° to 60° C. in a polar solvent.

If a polyamic acid amide, namely a silicon-containing polyimide precursor (ba), contains carboxyl groups as a side chain, a silicon-containing polyamic acid amide (bb) of a higher amide content can be obtained by further amidation of a silicon-containing polyimide precursor (ba) by adding a monovalent amine.

The second method of the above two may be carried out as follows:

The above silicon-containing polyamic acid amide (bb) can also be obtained by carrying out amidation of the above-mentioned silicon-containing polyimide precursor (polyamic acid) (obtained from a tetracarboxylic dianhydride represented by the formula (1), a diamine represented by the formula (4) and an amino silicon compound represented by the formula (5)), that is, adding a monovalent amine to the above silicon-containing polyimide precursor, according to a known method.

As the reaction for forming the amide bond between the molecules, there can be applied an addition reaction of the tetracarboxylic dianhydride and the amine, or a known reaction in which a dehydrating agent or a condensation agent such as N,N'-dicyclohexylcarbodiimide, N-ethoxycarbonyl-2-ethoxy-1,2-dihydroquinoline, N,N'-carbonyldiimidazole or the like is reacted between the diamine and the carboxyl group contained in the derivative formed by adding the monovalent amine to the tetracarboxylic dianhydride. At this time, the mixing ratio of the derivative formed by adding the amine to the tetracarboxylic dianhydride, the diamine and the aminosilicon compound, as reaction components, respectively, is required to meet the above-mentioned formulae (6) and (7). If the amounts of the respective components deviate from the range of the formula (6), the viscosity of the obtained silicon-containing polyimide precursor noticeably changes with lapse of time, and shelf stability is poor. If C/(C+B) in the formula (7) is less than 0.1, sufficient photosensitivity cannot be obtained, and adhesion to the substrate is also poor.

The amidation of the carboxyl group in the silicon-containing polyimide precursor obtained by the first method or in the polyamic acid obtained by the second method, with the monovalent amine, can be achieved by reacting the portion of the carboxyl group with a dehydrating agent such as N,N'-dicyclohexylcarbodiimide, N-ethoxycarbonyl-2-ethoxy-1,2-dihydroquinoline or the like to convert the same into such an isoimide as shown in the following:

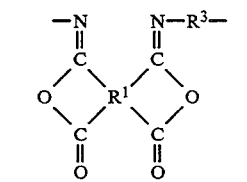

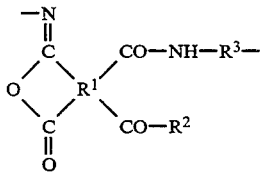

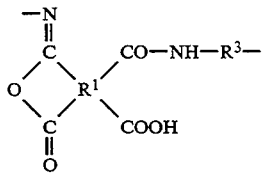

and then adding the monovalent amine to the isoimide. The degree of the amidation can be changed in a wide range by controlling the amount of the isoimide which depends upon the amount of the dehydrating agent or the amount of the monovalent amine.

When the carboxyl group of the silicon-containing polyimide precursor (ba) is converted into the isoimide, imidization occurs partially owing to a side reaction, but the amount of the resulting imide is limited, which, however, does not substantially have an influence on the present invention.

The monovalent amine which can be used in the first or second method is a primary or secondary monovalent amine of 1 to 8 carbon atoms, represented by the above formula (2) or (3), wherein $R^6$ is a monovalent organic group which is mainly composed of a hydrocarbon group such as an alkyl group, a phenyl group or a phenyl group substituted by alkyl groups, and it may contain ether bonds or hydroxyl groups in its molecule;

$R^7$ is a hydrogen atom or a monovalent organic group as defined by $R^6$; and $R^8$ is a divalent organic group of 1 to 8 carbon atoms such as a hydrocarbon group mainly composed of methylene chains, and it can contain ether bonds.

The main chain of the polyamic acid amide which can be used in the thus obtained photosensitive resin composition of the present invention comprises constitutional units represented by the formula (10) or (11), but may further comprise constitutional units represented by the formula (12), (13), (14) or (15):

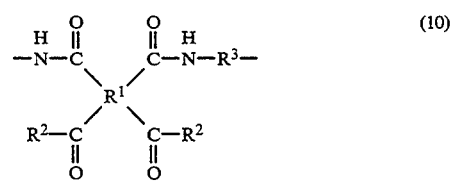

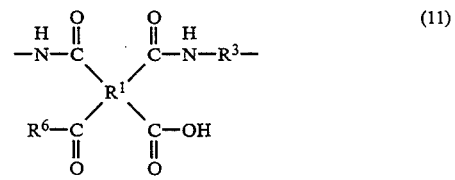

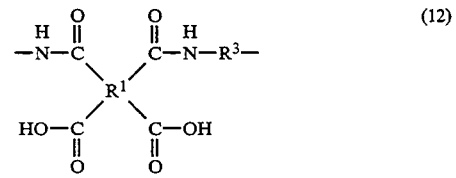

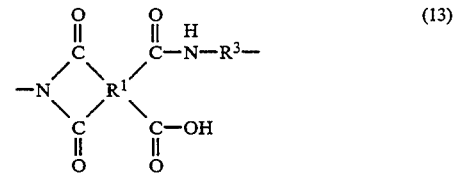

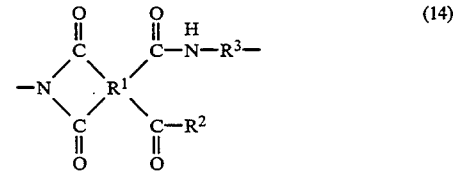

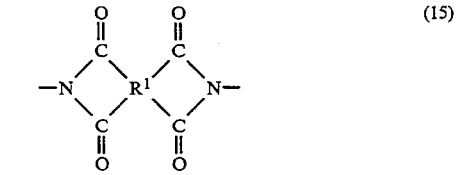

(wherein each $R^1$ is at least one tetravalent organic group selected from the group consisting of a tetravalent carbocyclic aromatic group, a heterocyclic group, an alycyclic group or an aliphatic group, each group having 4 to 30 carbon atoms; $R^2$ is

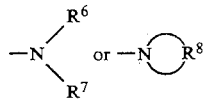

(wherein $R^6$ is independently a monovalent organic group having 1 to 8 carbon atoms; $R^7$ is a hydrogen atom or a monovalent organic group having 1 to 7 carbon atoms; $R^8$ is a divalent organic group having 1 to 8 carbon atoms); $R^3$ represents at least one divalent organic group having 2 to 30 carbon atoms selected from the group consisting of an aliphatic group, an alicyclic group, an araliphatic group, a carbocyclic aromatic group, or a divalent polysiloxane group having a hundred or less siloxane units.)

The polyamic acid comprises such constitutional units that the content of the carboxyl group is preferably kept within the total number of the constitutional units (namely, the ratio of the residual carboxyl group to the polyamic acid is within 50%), because the shelf stability and heat stability at the time of patterning are damaged by too large a quantity of the carboxyl groups. The content of the imide group which occurs partially owing to a side reaction is preferably kept within 80% of the total number of the constitutional units (namely, the imidization ratio is within 40%), because the solubility of the polyamic acid amide decreases, as the content of the imide group increases.

Every polyimide precursor which can be used in the photosensitive resin composition of the present invention can be converted into a silicon-containing polyimide whose main chain is composed of a common structural unit represented by the formula

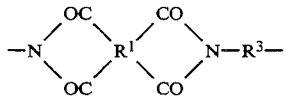

by baking, even if the carboxyl group and the amide portion in the precursor are present in any ratios. Therefore, the ratios of the carboxyl group and the amide structure in the polyimide precursor can be selected depending upon its use applications.

In the polyamic acid amide obtained by the above-mentioned method, the aminosilicon compound of the formula (5) is introduced into its molecular terminals; hence the precursor has a hydrolytic alkoxyl group bonded to a silicon atom at the molecular terminals. Such an alkoxyl group at the molecular terminal can form such a siloxane bond as in the formula

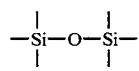

between the molecular terminals by condensation. This condensation can be accelerated by an acid or heat, if necessary.

In order to decrease the volume shrinkage of the polyamic acid amide at the time of baking, X in the above formula (5) is preferably an alkoxy group having a small number of carbon atoms. Examples of the preferred X include methoxy, ethoxy, propoxy or butoxy group.

In addition, the logarithmic viscosity number of this polyamic acid amide is suitably in the range of 0.1 to 5 dl/g from the viewpoint of film formation properties. Here, the logarithmic viscosity number is $\eta_{inh}$ represented by the formula $$\eta_{inh} = \frac{\ln(\eta/\eta_o)}{C}$$

(wherein $\eta$ and $\eta_o$ are values measured at a temperature of 30°±0.01° C. in a solution and in N-methyl-2-pyrrolidone, respectively, by the use of an Ubbelohde's viscometer; and C is a solution concentration, i.e., 0.5 g/dl).

When the thus obtained polyamic acid amide is blended with the compound for generating an acid by light irradiation, the photosensitive resin composition of the present invention can be obtained.

The amount of the compound for generating an acid by light irradiation to be blended is in the range of 0.01 to 30 parts by weight, preferably 0.5 to 15 parts by weight based upon 100 parts by weight of the above-mentioned polyimide precursor. If the amount of this compound is less than 0.01 part by weight, the sensitivity is low, and if it is more than 30 parts by weight, the film quality of the cured polyimide deteriorates undesirably.

Next, reference will be made to the tetracarboxylic dianhydride of the formula (1) ($a'$), the diamine of the formula (4) ($b'$), the aminosilicon compound of the formula (5) ($c'$) and the polar solvent ($d'$) which are reaction components for obtaining the silicon-containing polyimide precursor in the composition of the present invention.

Typical examples of the tetracarboxylic dianhydride ($a'$) are the following known compounds, but they are not limited thereto. That is, they include aromatic tetracarboxylic dianhydrides such as pyromellitic dianhydride, 3,3',4,4'-biphenyltetracarboxylic dianhydride, 2,2',3,3'-biphenyltetracarboxylic dianhydride, 2,3,3',4'-biphenyltetracarboxylic dianhydride, 3,3',4,4'-benzophenonetetracarboxylic dianhydride, 2,2',3,3'-benzophenonetetracarboxylic dianhydride, 2,3,3',4'-benzophenonetetracarboxylic dianhydride, bis (3,4-dicarboxyphenyl) ether dianhydride, bis (3,4-dicarboxyphenyl) sulfone dianhydride, 1,2,5,6-naphthalenetetracarboxylic dianhydride, 2,3,6,7-naphthalenetetracarboxylic dianhydride, 2,2-bis(3,4-dicarboxyphenyl)hexafluoropropane dianhydride and the like; alicyclic tetracarboxylic dianhydrides such as cyclobutanetetracarboxylic dianhydride, methylcyclobutanetetracarboxylic dianhydride and the like, and aliphatic tetracarboxylic dianhydride such as 1,2,3,4-tetracarboxybutane dianhydride and the like.

Typical examples of the derivative obtained by adding an amine to the tetracarboxylic dianhydride which can be used in the present invention include those which can be obtained by adding amines represented by the formula (2) or (3) such as methylamine, ethylamine, propylamine, butylamine, pentylamine, hexylamine, heptylamine, octylamine, dimethylamine, diethylamine, dipropylamine, dibutylamine, cyclopropylamine, cyclobutylamine, cyclopentylamine, cyclohexylamine, cycloheptylamine, cyclooctylamine, aniline, toluidine, xylidine, N-methylaniline, N-ethylaniline, N-methylcyclohexylamine, N-ethylcyclohexylamine, 4-methylcyclohexylamine, 2-(1-cyclohexenyl)ethylamine, propyleneimine, pyrrolidine, piperidine, hexamethyleneimine, heptamethyleneimine, ethanolamine, diethanolamine, propanolamine, dipropanolamine, N-methylethanolamine, N-ethylethanolamine, morpholine, 2-methoxyethylamine, 2-ethoxyethylamine and the like, to the above-mentioned typical examples of the tetracarboxylic dianhydrides.

Typical examples of the diamine (b') are the following compounds, but they are not restrictive. That is, they include aromatic diamines such as 4,4'-diamino diphenyl ether, 3,4'-diamino diphenyl ether, 4,4'-diaminodiphenylmethane, 4,4'-diaminodiphenylsulfone, 4,4'-diaminodiphenyl sulfide, 4,4'-di(metaaminophenoxy)diphenylsulfone, 4,4'-di(paraamtnophenoxy)diphenylsulfone, orthophenylenediamine, metaphenylenediamine, paraphenylenediamine, benzidine, 3,3'-diaminobenzophenone, 4,4'-diaminobenzophenone, 4,4'-diaminodiphenyl-2,2-propane, 1,5-diaminonaphthalene, 1,8-diaminonaphthalene, 4,4'-bis(4-aminophenoxy)biphenyl, 2,2-bis{4-(4-aminophenoxy)phenyl}-hexafluoropropane, 1,4-bis(4-aminophenoxy)benzene, 1,3-bis(4-aminophenoxy)benzene,4,4'-diamino-3,3'-diethyl-5,5-di methyldiphenylmethane, 4,4'-diamino-3,3',5,5'-tetramethyldiphenylmethane, 1,4-diaminotoluene, metaxylylenediamine, 2,2'-dimethylbenzidine and the like; aliphatic diamines such as trimethylenediamine, tetramethylenediamine, hexamethylenediamine, 2,11-dodecanediamine and the like; silicon-based diamines such as bis(paraaminophenoxy)dimethylsilane, 1,4-bis(3-aminopropyldimethylsilyl)benzene and the like; allcyclic diamines such as 1,4-diaminocyclohexane, bis(4-aminocyclohexyl)methane,isophoronediamine and the like; guanamines such as acetoguanamine, benzoguanamine and the like.

As the diamine, a diaminopolysiloxane can also be used, but its examples include compounds represented by the formulae (wherein p is in the range of from 1 to 100):

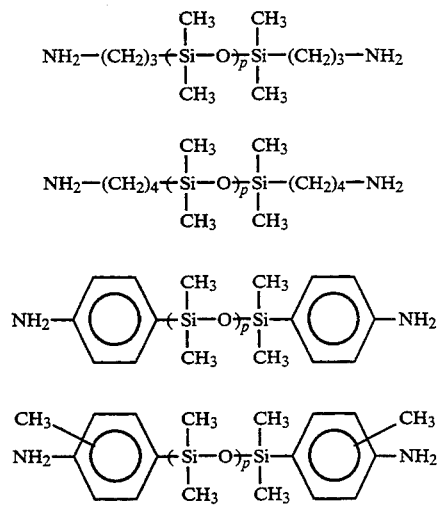

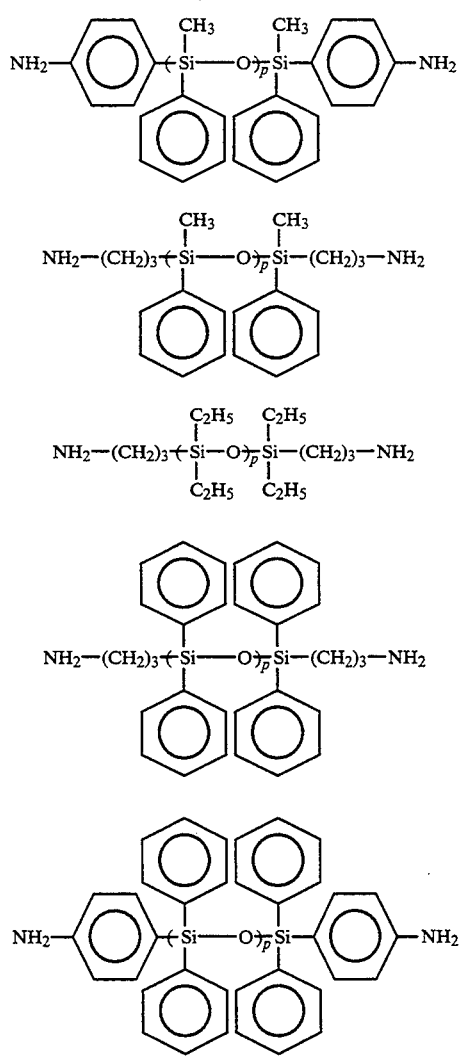

Known diamines other than the mentioned above can also be widely used.

Typical examples of the aminosilicon compound (c') are the following compounds, but they are not always restricted thereto. They include aminomethyl-di-n-propoxymethylsilane, (β-aminoethyl)-di-n-propoxymethylsilane, (β-aminoethyl)-diethoxyphenylsilane, (β-aminoethyl)-tri-n-propoxysilane, (β-aminoethyl)-dimethoxy-methylsilane, (γ-aminopropyl)-di-n-propoxymethylsilane,(γ-aminopropyl)-di-n-butoxy-methylsilane, (γ-aminopropyl)-trimethoxysilane, (γ-aminopropyl)-triethoxysilane, (γ-aminopropyl)-di-n-pentoxyphenylsilane, (γ-aminopropyl)-methoxy-n-propoxymethylsilane, (δ-aminobutyl)-dimethoxy-methylsilane, (3-amtnophenyl)-di-n-propoxy-methylsilane, (4-aminophenyl)-tri-n-propoxysilane, [β-(4-aminophenyl)-ethyl]-diethoxy-methylsilane, [β-(3-aminophenyl)-ethyl]-di-n-propoxy-methylsilane, [γ-(4-aminophenyl)-propyl]-di-n-propoxy-ethylsilane, [γ-(4-aminophenoxy)-propyl]-di-n-propoxy-methylsilane, [γ-(3-aminophenoxy)-propyl]-di-n-butoxy-methylsilane, (γ-aminopropyl)-methyl-dimethoxysilane, (γ-aminopropyl)-ethyl-di-n-propoxysilane, 4-aminophenyl-trimethoxysilane, 3-aminophenyl-trimethoxysilane, 4-aminophenyl-methyl-dimethoxysilane, 3-aminophenyl-di-methyl-methoxysilane, 4-aminophenyl-tri-ethoxysilane and the like.

Typical examples of the solvent (d'), in which the above-mentioned reaction components (a'), (b') and (c') are reacted, include N-methyl-2-pyrrolidone, N,N-dimethylacetamide, N,N-dimethylformamide, dimethyl sulfoxide, tetramethyl urea, pyridine, hexamethylphosphoramide, methylformamide, N-acetyl-2-pyrrolidone, 2-methoxyethanol, 2-ethoxybutanol, 2-butoxyethanol, diethylene glycol monomethyl ether, diethylene glycol monoethyl ether, diethylene glycol monobutyl ether, cyclopentanone, cresol, γ-butyrolactone, isophorone, N,N-diethylacetamide, N,N-diethylformamide, N,N-dimethylmethoxyacetamide, tetrahydrofuran, N-methyl-ε-caprolactam, tetrahydrothiophene dioxide (sulfolane) and the like.

The above-mentioned polar solvents can be diluted with another aprotonic (neutral) organic solvent, and examples of such an organic solvent include aromatic, alicyclic and aliphatic hydrocarbons and chlorinated derivatives thereof (benzene, toluene, xylene, cyclohexane, pentane, hexane, petroleum ether, methylene chloride etc.), alcohols and dioxanes.

As the compound for generating an acid by light irradiation which can be used in the composition of the present invention, many known compounds and mixtures thereof can be used. Typical examples of these compounds include onium compounds such as ammonium salts, diazonium salts, iodonium salts, sulfonium salts, selenium salts, arsonium salts and the like; organic halogen compounds such as phenyltrihalomethylsulfone compounds, halomethyltriazine compounds, halomethyloxadiazole compounds and the like; and sulfonic acid-generating agents such as esters or amide compounds of 1,2-naphthoquinonediazido-(2)-4-sulfonic acid, sulfonic acid ester compounds of nitrobenzyl alcohols, sulfonic acid ester compounds of oximes, sulfonic acid ester compounds of N-hydroxyamides or imides, β-ketosulfone compounds, and sulfonic acid ester compounds of benzoin and the like.

Typical examples of the above-mentioned compounds are the following compounds, but they are not always restricted thereto. They include di(paratertiarybutylbenzene) diphenyliodonium trifluoromethane sulfonate, diphenyliodonium tetrafluoroborate, diphenyliodonium hexafluorophosphate, diphenyliodonium trifluoromethane sulfonate, benzenediazoniumparatoluene sulfonate, 4-p-tryl-mercapto-2,5-diethoxy-benzenediazoniumhexafluorophosphate, diphenylamine-4-diazonium sulfate, tri(tertiarybutylphenyl)sulfonium trifluoromethane sulfonate, triphenylsulfonium trifluoromethane sulfonate, triphenylselenium tetrafluoroborate, orthonitrobenzylparatoluene sulfonate, benzoin tosylate, benzoinmethane sulfonate, benzointrifluoromethane sulfonate, benzoin-2-trifluoromethanebenzene sulfonate, anisoin rosylate, anisoinmethane sulfonate, anisointrifluoromethane sulfonate, anisoin-2-trifluoromethanebenzene sulfonate, 1-benzoyl-1-methylsulfonyloxy-cyclohexane, 2-[(p-tolylsulfonyl)oxy]-1-phenyl-1-octanone, 2-[(β-naphthylsulfonyl)oxy]-1-phenyl-1-propanone, 2-[(p-acetoamidophenylsulfonyl)oxy]-1-phenyl-1-propanone, benzamido rosylate, benzamidomethane sulfonate, N-tosyloxyphthalimide, N-[(2-trifluoromethanebenzenesulfonyl)oxy]phthalimide, N-tosyloxy-1,8-naphthalimide, N-[(2-trifluoromethanebenzenesulfonyl)oxy]-1,8-naphthalimide, N-tosyloxy-2,3-diphenylmaleimide, N-[(2-trifluoromethanebenzenesulfonyl)oxy]-2,3-diphenylmaleimide, 4-(di-n-propylamino)-benzonium tetrafluoroborate, 4-methyl-6-trichloromethyl-2-pyrrone, 4-(3,4,5-trimethoxystyryl)-6-trichloromethyl-2-pyrrone, 4-(4-methoxystyryl)-6-(3,3,3-trichloropropenyl)-2-pyrrone, 2-trichloromethylbenzimidazole, 2-tribromomethylquinone, 2,4-dimethyl-1-tribromoacetylbenzene, 4-dibromoacetylbenzoic acid, 1,4-bis-dibromomethylbenzene, tris-dibromomethyl-s-triazine, 2-(6-methoxynaphthyl-2-yl)-4,6-bis-trichloromethyl-s-triazine, 2-(naphthyl-1-yl)-4,6-bis-trichloro-s-triazine, 2-(naphthyl-2-yl)-4,6-bistrichloromethyl-s-triazine, 2-(4-ethoxynaphthyl-1-yl)-4,6-bis-trichloromethyl-s-triazine, 2-(benzopyranyl-3-yl)-4,6-bis-trichloromethyl-s-triazine, 2-(4-methoxy-antracen-1-yl)-4,6-bis-trichloromethyl-s-triazine, 2-(phenethyl-9-yl)-4,6-bis-trichloromethyl-s-triazine, o-naphthoquinonediazido-5-sulfonate, 2-phenyl-5-trichloromethyloxadiazole, 2-(p-methoxyphenyl)-5-trichloromethyloxadiazole, 2-styryl-5-trichloromethyloxadiazole, 2-(n-butyl)-5-trichloromethyloxadiazole, α-trifluoroacetophenoneoxime-4-hydroxybenzene sulfonate, 9-(4-hydroxybenzenesulfonyloxyimino)-fluorene, 9-(4-methacylamidomethylbezenesulfonyloxyimino)-fluorene, 2-(4-methoxystyryl)-4,6-bis(trichloromethyl)-s-triazine, diphenyl(4-thiophenoxyphenyl)sulfoniumhexafluoro antimonate, (4-methoxyphenyl)phenyliodonium trifluoromethane sulfonate, 2,6-dinitrobenzyl tosylate, N-[(methanesulfonyl)oxy]-2-(α-naphthyl)-3-phenylmaleimide, N-[(trifluoromethanesulfonyl)oxy]-2-(α-naphthyl)-3-phenylmaleimide, 2-diazo-1-naphthoquinone-4-(2,3,4-trihydroxybenzophenone)sulphonate and the like. However, these compounds are not restricted thereto.

Furthermore, in the photosensitive resin composition of the present invention, a sensitizing agent, a dye, a pigment, a surface active agent and the like can be used, if necessary.

The photosensitive resin composition of the present invention is usually supplied in the state of a solution. This photosensitive resin composition is applied onto the substrate, and after the removal of the solvent, the composition on the substrate is irradiated with light to generate an acid. The thus generated acid functions as a catalyst, so that condensation proceeds between the alkoxy groups of the aminosilicon compound introduced into the polyamic acid amide (polyimide precursor). As a result, the portion which has undergone the light irradiation becomes insoluble in any of the organic solvents mentioned above as the examples of the reaction solvents or an aqueous alkaline solution, and by the utilization of this fact, a relief pattern of a negative type polyamic acid amide (negative type polyimide precursor) can be formed. In the thus obtained patterned polyamic acid amide (polyimide precursor) and a cured material subjected to imidization by heating and dehydration, removal of amine or removal of alcohol and condensation between the alkoxy groups, an aminosilicon compound which contributes to the adhesion to the substrate is introduced into the polymer, and therefore the adhesion to the substrate is extremely excellent and a substrate treatment using a coupling agent is not required any more. In addition, since the photosensitivity can be given only by blending a small amount of the compound for generating the acid with the aid of light, the volume shrinkage at the time of curing can be inhibited.

Next, reference will be made to procedures for forming the patterned polyamic acid amide (polyimide precursor) and the silicon-containing polyimide by the use of the photosensitive resin composition of the present invention.

The photosensitive resin composition of the present invention can be applied to a substrate such as a silicon wafer, a metal plate, a plastic plate or a glass plate by a known means such as spin coat, immersion, printing, dispensing, roll coating and the like. The resultant coating film is prebaked at a temperature of from 30° to 150° C., preferably from 60° to 110° C. for a period of several minutes to several tens of minutes by the use of a heating means such as an electric furnace, a hot plate and the like to remove most of the solvent in the coating film therefrom.

Afterward, a negative mask is put on this coating film, followed by irradiation with chemical rays. Examples of the chemical rays include X rays, electron beams, ultraviolet rays and visible light, but ultraviolet rays and electron beams are particularly desirable. In succession, if necessary, the curing due to the condensation with the acid generated by the light irradiation can be accelerated by heating the coating film at a temperature of from 30° to 200° C., preferably from 60° to 190° C. for a period of from 30 seconds to 15 minutes by means of the above-mentioned heating means.

Next, the unexposed portion is removed from the coating film by a developing agent to obtain a relief pattern. Examples of the developing solution used herein include the organic solvents mentioned above as the reaction solvents and mixtures of these solvents and poor solvents such as alcohols, xylene, water and the like. In addition to the above-mentioned organic solvents, there can also be used, as the developing solution, aqueous solutions of inorganic alkalis such as sodium hydroxide, potassium hydroxide, sodium carbonate, sodium silicate, sodium metasilicate and ammonia; aqueous solutions of organic amines such as ethylamine, n-propylamine, diethylamine, di-n-propylamine, triethylamine, methyldiethylamine, tetramethylammonium hydroxide, trimethylhydroxyethylammonium hydroxide and the like, and, in some cases, solutions formed by mixing these aqueous solutions with alcohols. Next, if necessary, the coating film is rinsed in a poor solvent such as an alcohol, water and the like, and then dried at a temperature of 150° C. or less. At any point of time after the prebaking, the film is peeled from the substrate, and it can also be used as a single film.

The polyamic acid amide (polyimide precursor) of the relief pattern formed by the development is in the form of the precursor of a polyimide, and so it is heated at a temperature of from 200° to 500° C., preferably from 300° to 400° C. for a period of from several minutes to several tens of minutes by the above-mentioned heating means, whereby the polyimide precursor is dehydrated or freed of amine to close a ring and thereby perform imidation, and in the portion of the aminosilicon compound, the condensation of the alkoxy groups proceeds, so that a patterned silicon-containing polyimide film is formed.

In accordance with such a procedure, the patterned heat-resistant silicon-containing polyimide film can be obtained from the photosensitive resin composition of the present invention. The photosensitive resin composition of the present invention can be applied to electronic materials, particularly various kinds of protective films for semiconductors, flattened films, passivation films, buffer coat films, $\alpha$-ray shield films for LSI memories, interlayer insulating films, interlayer films of multi-layer plates of printed-wiring boards, aligned films of liquid crystals, heat storage materials of thermal heads, and the like.

The photosensitive resin composition of the present invention can be easily manufactured by a method described in this specification, and a negative type sharp relief pattern can be formed from the composition. In addition, the shrinkage of a film at the time of curing by baking is small, and the adhesive properties of the film to a substrate are excellent.

EXAMPLES

Now, the present invention will be described in detail, but the scope of the present invention should not be limited to these examples.

Synthetic Example 1-Synthesis of a silicon-containing polyimide precursor(ba) (polyamic acid amide):

A 500 ml-flask equipped with a stirrer, a dropping funnel, a thermometer, a condenser and a nitrogen-replacing device was fixed in a thermostatic chamber. Next, 250 g of dehydrated and purified N-methyl-2-pyrrolidone (hereinafter abbreviated to "NMP"), 31.35 g (0.0973 mol) of 3,3',4,4'-benzophenone tetracarboxylic dianhydride (hereinafter abbreviated to BTDA) were poured into the flask, and they were continuously stirred. To the resulting solution was added 11.50 g (0.1946 mol) of n-propylamine, and reaction was carried out by stirring at 20° to 30° C. for 2 hrs., then 48.12 g (0.1946 mol) of N-ethoxy-carbonyl-2-ethoxy-1,2-dihydroquinoline (hereinafter abbreviated to EEDQ) was added to the solution, followed by stirring at 30° to 40° C. for 2 hrs. Further, 16.23 g (0.0811 mol) of 4,4'-diamino-diphenylether (hereinafter abbreviated to DDE) and 6.92 g (0.0324 mol) of 4-aminophenyl-tri-methoxysilane were added to the solution and the mixture was stirred at 20° to 30° C. for 6 hrs. Afterward, this solution was slowly poured into a large amount of methanol, so that a white precipitate occurred. This precipitate was collected by filtration, and then dried at 50° C. for 15 hrs. in a vacuum dryer to obtain a silicon-containing polyimide precursor (polyamic acid amide) in which 4-aminophenyl-tri-methoxysilane was introduced at the terminals.

Synthetic Example 2-Synthesis of a silicon-containing polyimide precursor(ba) (polyamic acid amide):

The same device as in Synthetic Example 1 was assembled. Next, 250 g of dehydrated and purified NMP and 20.74 g (0.0705 mol) of 3,3',4,4'-biphenyl tetra-carboxylic dianhydride (hereinafter abbreviated to BPDA) were poured into the flask, and they were continuously stirred. To the resulting solution was added 10.31 g (0.1410 mol) of diethylamine, and reaction was carried out by stirring at 20° to 30° C. for 2 hrs., then 10.16 g (0.0939 mol) of paraphenylenediamine , 10.02 g (0.0470 mol) of 4-aminophenyl-tri-methoxysilane and 29.08 g (0.1410) of N,N'-dicyclohexylcarbodiimide (hereinafter abbreviated to DCC) were added to the solution, followed by stirring at 20° to 30° C. for 8 hrs. Next, 13.81 g (0.0469 mol) of BPDA was added to the solution and reaction was carried out by stirring at 20° to 30° C. for 12 hrs. Afterward, precipitated urea compound was removed from this solution, and then the solution was slowly poured into a large amount of methanol, so that a white precipitate occurred. This precipitate was collected by filtration, and then dried at 50° C. for 15 hrs. in a vacuum dryer to obtain a silicon-containing polyimide precursor (polyamic acid amide) in which 4-aminophenyl-tri-methoxysilane was introduced at the terminals.

Synthetic Example 3-Synthesis of a silicon-containing polyamic acid amide (bb):

The same device as in Synthetic Example 1 was assembled. Next, 250 g of dehydrated and purified N,N-dimethylacetamide (hereinafter abbreviated to "DMAc"), 12.89 g (0.0644 mol) of DDE and 8.24 g (0.0386 mol) of 4-aminophenyl-tri-methoxysilane were poured into the flask, and they were continuously stirred. To the resulting solution was added 31.11 g (0.0965 mol) of BTDA, and reaction was carried out at 20° to 30° C. for 4 hrs. to obtain the solution of a silicon-containing polyamic acid in which 4-aminophenyl-tri-methoxysilane was introduced into terminals. Then, 39.83 g (0.1931 mol) of DCC was added to the solution, followed by stirring at 20° to 30° C. for 2 hrs. to perform isoimidization. Further, 13.73 g (0.1931 mol) of pyrrolizine was added to the solution and the mixture was stirred at 20° to 30° C. for 4 hrs. After precipitated urea compound was removed from the solution, the solution was slowly poured into a large amount of methanol, so that a white precipitate occurred. This precipitate was collected by filtration, and then dried at 50° C. for 18 hrs. in a vacuum dryer to obtain a silicon-containing polyamic acid amide in which 4-aminophenyl-tri-methoxysilane was introduced into terminals.

Synthetic Example 4-Synthesis of a silicon-containing polyamic acid amide (bb):

The same device as in Synthetic Example 1 was assembled. Next, 250 g of dehydrated and purified DMAc, 13.53 g (0.0544 mol) of bis(3-aminopropyl)tetramethyldisiloxane (hereinafter abbreviated to "APDS") and 2.78 g (0.0109 mol) of 4-aminophenyl-tri-ethoxy-silane were poured into the flask, and they were continuously stirred. To the resulting solution was added 13.19 g (0.0605 mol) of pyromellitic dianhydride (hereinafter abbreviated to PMDA), and reaction was carried out at 20° to 30° C. for 4 hrs. to obtain the solution of a silicon-containing polyamic acid in which 4-aminophenyl-tri-ethoxysilane was introduced at the terminals. Afterwards, 23.93 g (0.0968 mol) of EEDQ was added to the solution and the solution was followed by stirring at 30° to 40° C. for 2 hrs. to carry out isoimidation and further, 9.60 g (0.0968 mol) of cyclohexylamine was added to the solution to carry out reaction at 20° to 30° C. for 4 hrs. Then, the solution was slowly poured into a large amount of methanol, so that a white precipitate occurred. This precipitate was collected by filtration, and then dried at 50° C. for 15 hrs. in a vacuum dryer to obtain a silicon-containing polyamic acid amide in which 4-aminophenyl-tri-ethoxysilane was introduced at the terminals.

Synthetic Example 5-Synthesis of a silicon-containing polyamic acid amide (bb):

The same device as in Synthetic Example 1 was assembled. Next, 250 g of dehydrated and purified NMP, 14.38 g (0.0350 mol) of 2,2-bis(4-(4-aminophenoxy)-phenyl)propane (hereinafter abbreviated to "BAPP") and 1.11 g (0.0050 mol) of (γ-aminopropyl)-tri-ethoxysilane were poured into the flask, and they were continuously stirred. To the resulting solution was added 16.68 g (0.0376 mol) of 2,2-bis(3,4-dicarboxyphenyl)hexafluoropropane dianhydride and reaction was carried out at 20° to 30° C. for 4 hrs. to obtain the solution of a silicon-containing polyamic acid in which (γ-aminopropyl)-tri-ethoxysilane was introduced into terminals. Afterwards, 18.57 g (0.0751 mol) of EEDQ was added to the solution and the solution was followed by stirring at 30° to 40° C. for 2 hrs. to carry out isoimidization and further, 6.54 g (0.0750 mol) of morpholine was added to the solution to carry out a reaction at 20° to 30° C. for 4 hrs. Then, the solution was slowly poured into a large amount of methanol, so that a white precipitate occurred. This precipitate was collected by filtration, and then dried at 50° C. for 15 hrs. in a vacuum dryer to obtain a silicon-containing polyamic acid amide in which γ-aminopropyl-tri-ethoxysilane was introduced at the terminals.

Synthetic Example 6-Synthesis of a silicon-containing polyamic acid amide (bb):

The same device as in Synthetic Example 1 was assembled. Next, 250 g of dehydrated and purified NMP, 16.29 g (0.0377 mol) of 4,4'-di(p-aminophenoxy)diphenylsulfone (hereinafter abbreviated to "BAPS") and 5.97 g (0.0201 mol) of 4-aminophenyl-tri-n-propoxysilane were poured into the flask, and they were continuously stirred. To the resulting solution was added 15.58 g (0.0502 mol) of bis(3,4-dicarboxyphenyl)ether dianhydride (hereinafter abbreviated to "ODPA" and reaction was carried out at 20 to 30 for 4 hrs. to obtain the solution of a silicon-containing polyamic acid in which 4-aminophenyl-tri-n-propoxysilane was introduced into terminals. Afterwards, 17.40 g (0.0704 mol) of EEDQ was added to the solution and the solution was followed by stirring at 30° to 40° C. for 2 hrs. to carry out isoimidization and further, 7.54 g (0.0704 mol) of p-toluidine was added to the solution to carry out a reaction at 20° to 30° C. for 4 hrs. Then, the solution was slowly poured into a large amount of methanol, so that a white precipitate occurred. This precipitate was collected by filtration, and then dried at 50° C. for 15 hrs. in a vacuum dryer to obtain a silicon-containing polyamic acid amide in which 4-aminophenyl-tri-n-propoxysilane was introduced at the terminals.

Synthetic Example 7-Synthesis of a silicon-containing polyamic acid amide (bb):

The same device as in Synthetic Example 1 was assembled. Next, 250 g of dehydrated and purified NMP, 13.31 g (0.0655 mol) of DDE and 2.12 g (0.0111 mol) of (γ-aminopropyl)-methyl-di-ethoxysilane were poured into the flask, and they were continuously stirred. To the resulting solution was added 15.71 g (0.0720 mol) of PMDA and reaction was carried out at 20° to 30° C. for 4 hrs. to obtain the solution of a silicon-containing polyamic acid in which (γ-aminopropyl)-methyl-di-ethoxysilane was introduced into terminals. Afterwards, 35.63 g (0.1441 mol) of EEDQ was added to the solution and the solution was followed by stirring at 30° to 40° C. for 2 hrs. to carry out isoimidization and further, 8.80 g (0.1441 mol) of ethanolamine was added to the solution to carry out a reaction at 20° to 30° C. for 4 hrs. Then, the solution was slowly poured into a large amount of methanol, so that a white precipitate occurred. This precipitate was collected by filtration, and then dried at 50° C. for 15 hrs. in a vacuum dryer to obtain a silicon-containing polyamic acid amide in which (γ-aminopropyl)-methyl-di-ethoxysilane was introduced at the terminals.

The results of the above-mentioned Synthetic Examples are summarized in Table 1 listed below. This Table shows mols of tetracarboxylic dianhdride , derivatives in which monovalent amines were added to the tetracarboxylic dianhydrides, monovalent amines, diamines, and aminosilicon compounds; solvents; values of C/(A−B) and C/(B+C); content ratio of carboxyl group and imidization ratio in polyamic acid amide, respectively.

In addition, the content of the carboxyl group is a value calculated from the amount of monovalent amine used for the introduction of amide side chains and the imidization ratios are measured by an infrared absorption spectrum method.

Abbreviations used in Table 1 are as follows:

(Amino silicon compounds)

APMS: 4-aminophenyl-tri-methoxysilane
APPS: 4-aminophenyl-tri-n-propoxysilane
APES: 4-aminophenyl-tri-ethoxysilane
APS-E: (γ-aminopropyl)-tri-ethoxysilane
APME: (γ-aminopropyl)-methyl-diethoxysilane (Solvents)

NMP: N-methyl-2-pyrrolidone
DMAc: N,N-dimethylacetamide

TABLE 1

| Synthetic Example No. | Reaction components | | | | Relation of A, B and C | | Monovalent amine | | |
|---|---|---|---|---|---|---|---|---|---|
| | Tetracarboxylic dianhydride or its derivative g (A mol) | Diamine g (B mol) | Aminosilicone compound g (C mol) | Solvent Kind g | Formula (6) C A − B | Formula (7) C B + C | Kind g (mol) | Carboxyl content (%) | Imidization ratio (%) |
| 1 | BTDA-P 42.85 (0.0973) | DDE 16.23 (0.0811) | APMS 6.92 (0.0324) | NMP 250 | 2.0 | 0.285 | n-propyl-amine 11.50 (0.1946) | 0 | 0 |
| 2 | BPDA-D 44.86 (0.1174) | PDA 10.16 (0.0939) | APMS 10.02 (0.0470) | NMP 250 | 2.0 | 0.333 | diethyl-amine 10.31 (0.1410) | 40 | 0 |
| 3 | BTDA 31.11 (0.0965) | DDE 12.89 (0.0644) | APMS 8.24 (0.0386) | DMAc 250 | 1.2 | 0.638 | pyrrolidine 13.73 (0.1931) | 0 | 15 |
| 4 | PMDA 13.19 (0.0605) | APDS 13.53 (0.0544) | APES 2.78 (0.0109) | DMAc 250 | 1.8 | 0.167 | cyclo-hexylamine 9.60 (0.0968) | 20 | 13 |
| 5 | 6FDA 16.68 (0.0376) | BAPP 14.38 (0.0350) | APS-E 1.11 (0.0050) | NMP 250 | 1.9 | 0.125 | morpholine 6.54 (0.0750) | 0 | 18 |
| 6 | ODPA 15.58 (0.0502) | BAPS 16.29 (0.0377) | APPS 5.97 (0.0201) | NMP 250 | 1.6 | 0.348 | p-toluidine 7.54 (0.0704) | 30 | 8 |
| 7 | PMDA 15.71 (0.0720) | DDE 13.31 (0.0655) | APME 2.12 (0.0111) | NMP 250 | 2.0 | 0.222 | ethanol-amine 8.80 (0.1441) | 0 | 10 |

(Tetracarboxylic dianhydrides and derivatives in which monovalent amines were added to the tetracarboxylic dianhydrides)

PMDA: pyromellitic dianhydride
BTDA: 3,3′,4,4′-benzophenone tetracarboxylic dianhydride
BPDA: 3,3′,4,4′-biphenyl tetracarboxylic dianhydride
ODPA: bis(3,4-dicarboxylphenyl)ether dianhydride
6FDA : 2,2-bis(3,4-dicarboxylphenyl)hexafluoropropane dianhydride
BTDA-P: the derivative in which 2 mols ratio of n-propylamine was added to one mol ratio of BTDA.
BPDA-D: the derivative in which 1.2 mols ratio of diethylamine was added to one mol ratio of BPDA.

(Diamines)

DDE: 4,4′-diaminodiphenylether
BAPP: 2,2-bis(4-(4-aminophenoxy)phenyl)propane
BAPS: 4,4′-di(p-aminophenoxy)diphenylsulfone
PDA: paraphenylenediamine
APDS: bis(3-aminopropyl)tetramethyldisiloxane Example 1

20% by weight of solution was prepared by dissolving 2.50 g of polyamic acid amide synthesized in Synthetic Example 1 in 10 g of NMP. 0.125 gram of a compound for generating an acid by light irradiation (hereinafter abbreviated to "light acid generator") was added to the solution (in a ratio of 5 parts by weight of the light acid generator to 100 parts by weight of the polyamic acid amide) to prepare a photosensitive resin composition.

A silicon wafer was coated with this photosensitive resin composition by rotation, and then dried at 90° C. for 3 mins.(hereinafter this treatment was called "PB" and the temperature of PB, called "PB temperature"). At this time the rotation at the coating was adjusted so that the thickness of the dry film might be about 3 μm. Next, the coating film was exposed to light from an ultra-high pressure mercury arc lamp (9 mW/cm²) through a negative mask on which a pattern for forming holes of 10×10 μm was drawn. After the exposure, the film was heated for 2 mins. on a hot plate at 160° C. (hereinafter this treatment was called "PEB" and the temperature of PEB, called "PEB temperature"),followed by developing the film with a mixed solution of 70 parts by weight of NMP and 30 parts by weight of isopropylalcohol, rinsing with water, and drying. In consequence, a pattern having all the sharp holes of 10×10 μm was obtained on the film. This film having the pattern was baked at 150° C. for 30 mins. and further at 400° C. for 60 mins., but no breakage of the pattern was observed. The exposure of the irradiated light and the test results of the patterning are shown in Table 2.

Examples 2 to 7

The same procedure as in Example 1 was carried out except that solvents, polyamic acid amides, concentrations of the solutions, light acid generators, parts by weight of the light acid generators, PB temperatures, the amounts of exposure and PEB temperatures were changed as shown in Table 2, to prepare photosensitive resin compositions. In all the cases, any breakage of the patterns-was not observed.

Moreover, in order to confirm the magnitude of the change of film thickness which was caused by volume shrinkage at the time of curing by heating, the thickness of a film after a final baking was subtracted from that of a film after the development of an exposed portion in each example, and an obtained value was then divided by the thickness of the film after the development and the resulting value was expressed by percentage. The result are shown in Table 2.

Afterward, a cured film was formed on a silicon wafer in the same manner as in the above-mentioned examples except that no mask was used in order to confirm adhesion to the substrate, and the cured film was divided into 100 small square pieces having a size of 2×2 mm. Next, a cellophane tape was stuck on the surface of each piece and then immediately peeled therefrom. The number of the pieces peeled from the tape was counted to evaluate the adhesion. The results are shown in Table 2.

Abbreviations used in Table 2 are as follows:

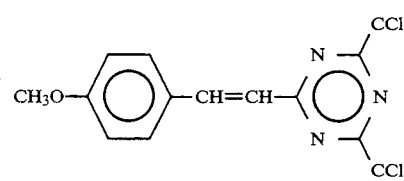
PA-1

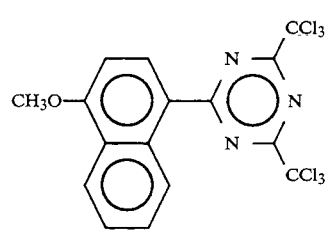
PA-2

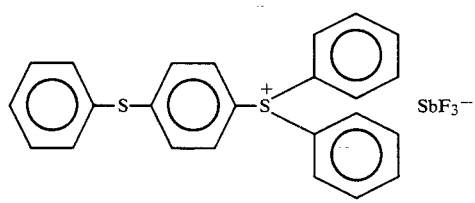
PA-3

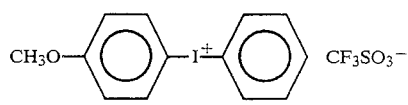
PA-4

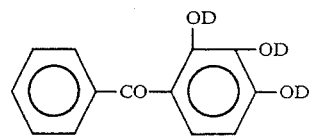
PA-5

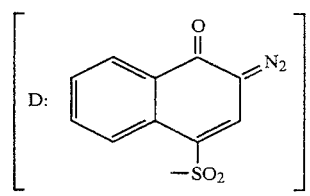
D:

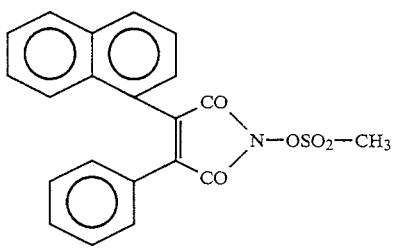
PA-6

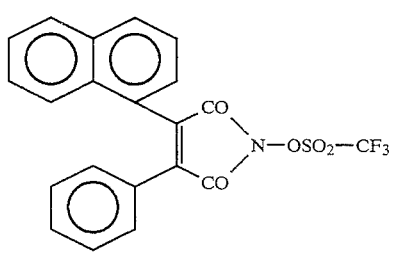
PA-7

Comparative Example 1

A polyamic acid was synthesized by the utilization of the same device except that a one-liter flask was used instead of the 500-ml flask and procedure as in Synthetic Example 1 and by the use of 500 g of NMP, 42.05 g (0.1305 mol) of BTDA and 26.13 g (0.1305 mol) of DDE. Then, 0.96 g of dimethylaminoethyl methacrylate and 0.05 g of Michler's ketone were added to 10 g of this solution, to prepare a photosensitive composition. By the use of this solution, the change of film thickness and adhesion were evaluated by the same procedure as in each example. As a developing solution, a mixed solution of 70 parts by weight of NMP and 30 parts by weight of isopropyl alcohol was used. Exposures of irradiated light and the respective evaluation results are set forth in Table 2. From comparison with the Examples, it is apparent that in the photosensitive resin composition of the present invention, the change of the film thickness is small and the adhesion to the substrate is excellent.

TABLE 2

| Example | Photosensitive resin composition Solvent wt. (g) | Polyamic acid amide wt. (g) conc (wt. %) | Light acid generator (g) | PB PB Temp. (°C.) | Exposure conditions Exposure (mJ/cm$^2$) | PEB PEB Temp. (°C.) | Patterned polyimide film Change of film thickness (%) | Adhesive properties (No. of peeled pieces) |
|---|---|---|---|---|---|---|---|---|
| 1 | NMP (10.0) | Synthetic ex. 1 (2.50) (20.0) | PA-1 (0.125) 5.0 | 90 | 100 | 160 | 27 | 0 |
| 2 | NMP (10.0) | Synthetic ex. 2 (2.82) (22.0) | PA-2 (0.141) 5.0 | 70 | 130 | 80 | 29 | 0 |
| 3 | DMAc (10.0) | Synthetic ex. 3 (3.89) (28.0) | PA-6 (0.058) 1.5 | 90 | 150 | 170 | 26 | 0 |
| 4 | DMAc (10.0) | Synthetic ex. 4 (3.70) (27.0) | PA-7 (0.481) 13.0 | 80 | 180 | 90 | 33 | 0 |
| 5 | DMAc (10.0) | Synthetic ex. 5 (1.49) (13.0) | PA-3 (0.149) 10.0 | 100 | 260 | 160 | 26 | 0 |
| 6 | NMP (10.0) | Synthetic ex. 6 (2.50) (20.0) | PA-4 (0.175) 7.0 | 70 | 220 | 80 | 25 | 0 |
| 7 | NMP (10.0) | Synthetic ex. 7 (1.49) (13.0) | PA-5 (0.104) 7.0 | 90 | 200 | 160 | 27 | 0 |
| Comp. ex. 1 | | Comp. ex. 1 | | | 1500 | | 45 | 100 |

Effectiveness of the Invention

The photosensitive resin composition of the present invention can form a negative type, clear relief pattern, can have a small reduction in the film thickness at the time of baking, and a superior adhesion onto the substrate and can form a silicon-containing polyimide by baking.

What we claim is:

1. A photosensitive resin composition comprising the following (b) and (c):

(b) at least one polyamic acid amide selected from the group consisting of the following groups (ba) and (bb):

(ba) a silicon-containing polyimide precursor obtained from

A mol of a derivative formed by adding 2 mols or less of a primary or secondary amine represented by the formula (2) or (3):

(2)

(3)

wherein R$^6$ represents at least one organic group of 1 to 8 carbon atoms, R$^7$ is a hydrogen atom or a monovalent organic group of 1 to 7 carbon atoms and R$^8$ represents a divalent organic group of 1 to 8 carbon atoms, to one mol of a tetracarboxylic dianhydride represented by the formula (1):

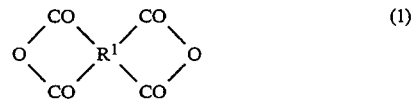
(1)

wherein R$^1$ is at least one tetravalent organic group selected from the group consisting of a tetravalent carbocyclic aromatic group, a heterocyclic group, an alicyclic group and an aliphatic group, each group having 4 to 30 carbon atoms, B mole of a diamine represented by the formula (4):

(4)

wherein R$^3$ represents at least one divalent organic group of 2 to 30 carbon atoms, selected from the group consisting of an aliphatic group, an alicyclic group, an araliphatic group and a carbocyclic aromatic group, or a divalent polysiloxane group having a hundred or less siloxane units, and C mol of an aminosilicon compound represented by the formula (5):

(5)

wherein
R$^4$ represents

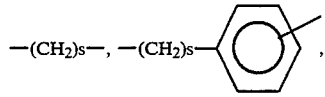

$R^5$ represents an alkyl group of 1 to 6 carbon atoms, a phenyl group or a phenyl group substituted by an alkyl group of 7 to 12 carbon atoms, X represents a hydrolytic alkoxy group, k is $1 \leq k \leq 3$, and s is an integer of 1 to 4, the ratio of (A), (B) and (C) satisfying the following formulas (6) and (7)

$$1 \leq \frac{C}{A-B} \leq 2.5 \quad (6)$$

$$0.1 \leq \frac{C}{B+C} \leq 1; \quad (7)$$

and (bb) a silicon-containing polyamic acid amide obtained by amidating said precursor (ba) with said monovalent amine represented by the formula (2) or (3), and (c) a compound for generating an acid by light irradiation.

2. A photosensitive resin composition according to claim 1, wherein said X in the formula (5) is an alkoxyl group of 1 to 4 carbon atoms and $R^4$ is a phenylene group or a trimethylene group.

3. A photosensitive resin composition according to claim 1, wherein the quantity of said compound for generating an acid by light irradiation (c) falls within a range of 0.5 to 15 parts by weight based upon 100 parts by weight of said polyamic acid amide (b).

4. A photosensitive resin composition according to claim 1 wherein said composition is a negative resist photosensitive resin composition.

* * * * *